(12) United States Patent
Blum

(10) Patent No.: US 7,573,335 B2
(45) Date of Patent: Aug. 11, 2009

(54) AUTOMATIC GAIN CONTROL (AGC) WITH LOCK DETECTION

(75) Inventor: Gregory A. Blum, Lagrangeville, NY (US)

(73) Assignee: Seiko Epson Corporation, Tokyo (JP)

( * ) Notice: Subject to any disclaimer, the term of this patent is extended or adjusted under 35 U.S.C. 154(b) by 24 days.

(21) Appl. No.: 11/877,447

(22) Filed: Oct. 23, 2007

(65) Prior Publication Data

US 2009/0102555 A1 Apr. 23, 2009

(51) Int. Cl.
*H03G 3/10* (2006.01)

(52) U.S. Cl. ...................................... 330/279

(58) Field of Classification Search ................. 330/279, 330/129–141; 455/234.1
See application file for complete search history.

(56) References Cited

U.S. PATENT DOCUMENTS

| | | | |
|---|---|---|---|
| 4,339,728 A | 7/1982 | Monticelli | |
| 4,360,787 A | * 11/1982 | Galpin | ........................ 330/284 |
| 4,408,351 A | 10/1983 | Maurer et al. | |
| 4,455,681 A | 6/1984 | Wile | |
| 4,479,266 A | 10/1984 | Eumurian et al. | |
| 4,516,248 A | 5/1985 | Barclay et al. | |
| 4,626,629 A | 12/1986 | Premoli et al. | |
| 4,634,997 A | 1/1987 | Tompsett et al. | |
| 4,653,117 A | 3/1987 | Heck | |
| 5,471,187 A | 11/1995 | Hansen et al. | |
| 5,563,916 A | 10/1996 | Scarpa | |
| 5,917,865 A | 6/1999 | Kopmeiners et al. | |
| 6,118,499 A | 9/2000 | Fang | |
| 6,577,196 B2 | 6/2003 | Hart | |
| 6,654,594 B1 | 11/2003 | Hughes et al. | |
| 6,668,027 B1 | 12/2003 | Scarpa | |
| 6,823,028 B1 | 11/2004 | Phanse | |
| 6,862,327 B2 | 3/2005 | Van Sinderen | |
| 6,954,628 B2 | 10/2005 | Minnis et al. | |
| 6,977,550 B2 | 12/2005 | Ishida et al. | |
| 7,024,172 B1 | 4/2006 | Murphy et al. | |
| 7,099,688 B2 | 8/2006 | Wilson | |
| 2004/0146119 A1 | 7/2004 | Weiner et al. | |
| 2005/0146643 A1 | 7/2005 | Lee | |
| 2006/0094390 A1 | 5/2006 | Pan et al. | |

FOREIGN PATENT DOCUMENTS

| | | |
|---|---|---|
| EP | 0926887 A2 | 6/1999 |
| JP | 04192771 | 7/1992 |
| JP | 2005311657 | 11/2005 |

\* cited by examiner

*Primary Examiner*—Robert Pascal
*Assistant Examiner*—Khiem D Nguyen

(57) ABSTRACT

A method, algorithm, circuits, and/or systems for automatic gain control (AGC) are disclosed. In one embodiment, an AGC circuit can include a comparator configured to compare an output of an amplifier against a reference voltage, gain logic configured to decrease a gain of the amplifier when an output of the comparator has a first state, and to periodically increase the gain of the amplifier, a digital-to-analog converter (DAC) configured to receive an output from the gain logic and control the gain of the amplifier, and lock detection logic configured to determine from the output of the gain logic when the gain of the amplifier is in a predetermined range.

22 Claims, 7 Drawing Sheets

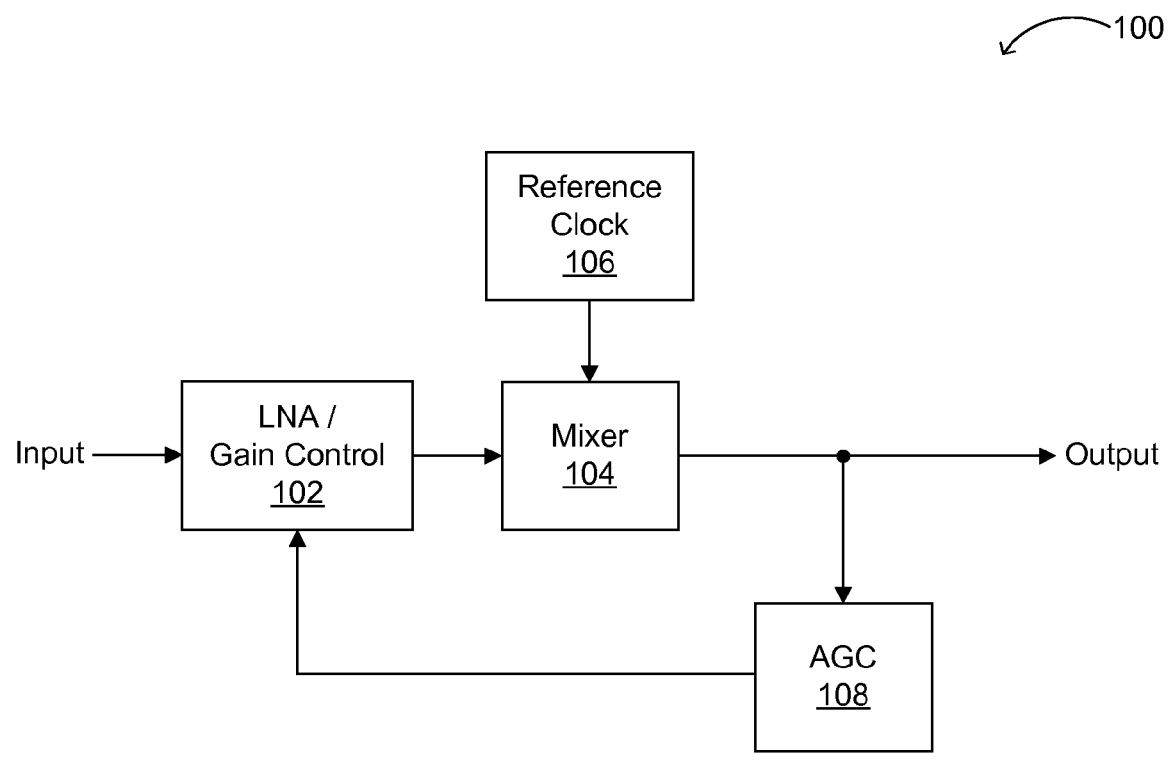
FIG. 1 (conventional)

AUTOMATIC GAIN CONTROL (AGC) WITH LOCK DETECTION

FIELD OF THE INVENTION

The present invention generally relates to the field of amplifier circuits. More specifically, embodiments of the present invention pertain to methods, circuits, and/or systems for automatic gain control (AGC) of an amplifier.

DISCUSSION OF THE BACKGROUND

In modern radio receivers, some form of automatic gain control (AGC) for a receiver is typically used. Such AGC can be used to counter component variation, which may translate into gain variation as a function of varying process parameters. This gain variation is undesirable in most modern radio receivers because a received analog signal may be transformed into a digital signal, which can be corrupted as a result of the gain variation.

FIG. 1 shows a conventional AGC loop 100 in a receiver. An input signal (e.g., from an antenna) can be received in low noise amplifier (LNA) with gain control 102. Mixer 104 can receive an output from amplifier 102, as well as a reference clock 106. AGC logic 108 can monitor the mixer output, and provide adjustment controls to amplifier 102. However, such conventional approaches may not provide AGC lock detection. Thus, an AGC approach suitable for controlling an amplifier and producing a signal indicating that the AGC is near or in its optimal (or locked) state would be advantageous.

SUMMARY OF THE INVENTION

Embodiments of the present invention relate to methods, algorithms, circuits, and/or systems for automatic gain control (AGC) of an amplifier.

In one embodiment, an AGC circuit can include a comparator configured to compare an output of an amplifier against a reference voltage, gain logic configured to decrease a gain of the amplifier when an output of the comparator has a first state, and periodically increase the gain of the amplifier (e.g., regardless of the state of the comparator output), a digital-to-analog converter (DAC) configured to receive an output from the gain logic and control the gain of the amplifier, and lock detection logic configured to determine from the output of the gain logic when the gain of the amplifier is in a predetermined range.

In another embodiment, a method of controlling a gain of an amplifier using AGC can include comparing an output of the amplifier against a reference voltage to provide a comparison result, decreasing the gain of the amplifier using gain logic when the comparison result has a first state, and periodically increasing the gain of the amplifier using the gain logic, and determining from an output of the gain logic when the gain of the amplifier is in a predetermined range.

In another embodiment, a method of detecting a lock condition of an amplifier in an AGC loop can include counting a first number of gain control signal pulses during a first predetermined period, counting a second number of gain control signal pulses during a second predetermined period, comparing each of said first and second number of gain control signal pulses against a predetermined pulse threshold to provide first and second comparison results, respectively, and asserting said lock condition when said first and second comparison results have a same state.

Embodiments of the present invention can advantageously provide a reliable and simplified AGC approach suitable for controlling an amplifier and producing a signal indicating that the AGC is near or in its locked state. These and other advantages of the present invention will become readily apparent from the detailed description of preferred embodiments below.

BRIEF DESCRIPTION OF THE DRAWINGS

FIG. 1 is a diagram showing a conventional automatic gain control (AGC) loop in a receiver.

DETAILED DESCRIPTION OF THE PREFERRED EMBODIMENTS

Figure 2:
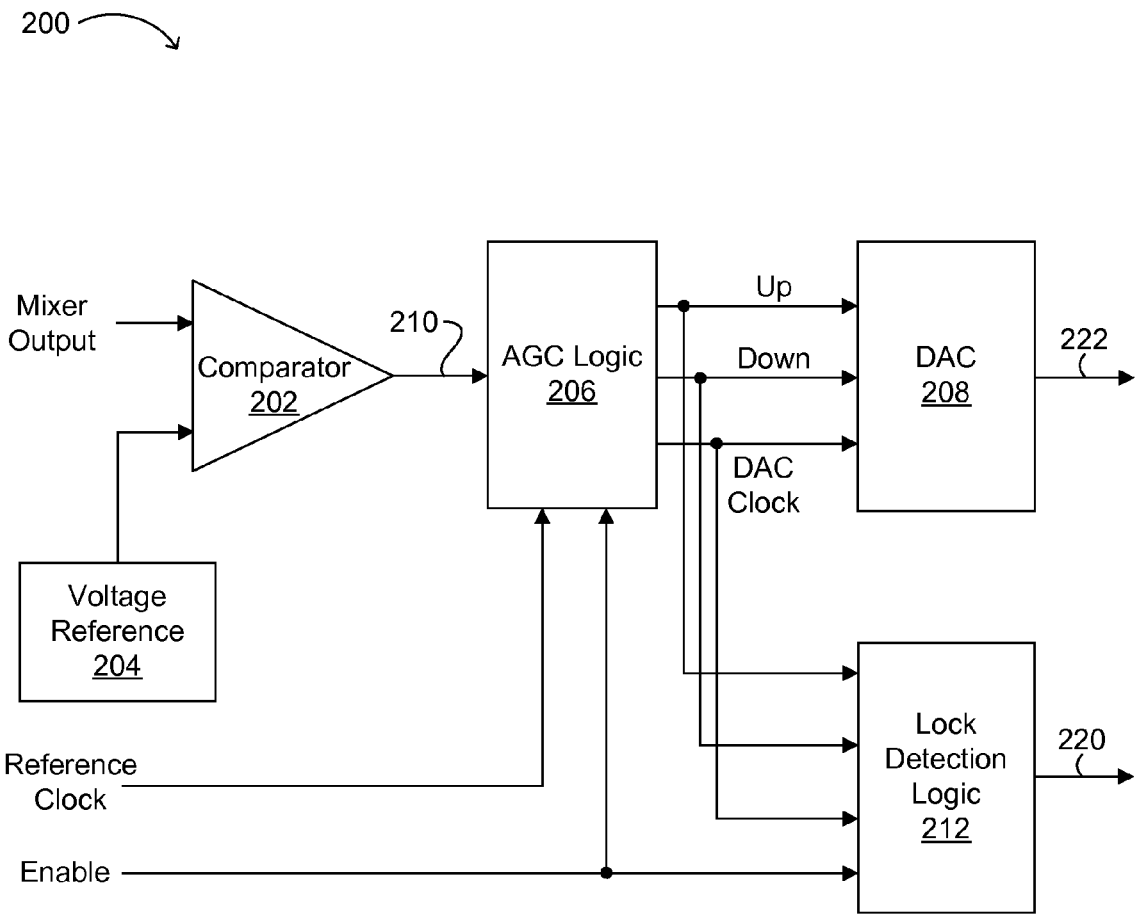
FIG. 2 is a block schematic diagram showing an exemplary AGC circuit in accordance with embodiments of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on code, data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilizing terms such as "processing," "operating," "computing," "calculating," "determining," "manipulating," "transforming" or the like, refer to the action and processes of a computer or data processing system, or similar processing device (e.g., an electrical, optical, or quantum computing or processing device or circuit), that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data similarly represented as physical quantities within other components of the same or a different system or architecture.

Furthermore, in the context of this application, the terms "wire," "wiring," "line," "signal," "conductor" and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Similarly, for convenience and simplicity, the terms "clock," "time," "timing," "rate," "period" and "frequency" are, in general, interchangeable and may be used interchangeably herein, but are generally given their art-recognized meanings. Also, for convenience and simplicity, the terms "data," "data stream," "waveform" and "information" may be used interchangeably, as may (a) the terms "flip-flop," "latch" and "register," and (b) the terms "connected to," "coupled with," "coupled to," and "in communication with," (which may refer to direct or indirect connections, couplings, or communications) but these terms are generally given their art-recognized meanings herein.

The invention relates to hardware implementations of the present structure, method and circuit. Embodiments of the present invention can advantageously provide a reliable and simplified automatic gain control (AGC) approach suitable for controlling an amplifier. Further, specific embodiments can also be used for producing a signal indicating that the AGC is near or in its locked state (e.g., within a predetermined amplifier gain range). The invention, in its various aspects, will be explained in greater detail below with regard to exemplary embodiments.

According to various embodiments of the present invention, a circuit for AGC can include: a comparator, a voltage reference or fixed voltage generator (for the comparator), gain logic, a digital-to-analog converter (DAC), and lock detection logic. A target application for the particular example circuitry shown herein is a radio receiver, where the radio receiver can include an amplifier, the AGC, and a mixer for mixing a reference clock with an output from the amplifier. In one embodiment, this mixer output can be compared to a fixed voltage level and provided to AGC circuitry for generating gain control for the amplifier. Of course, other types of circuits and/or digital logic blocks can also be utilized in specific embodiments.

An Exemplary AGC Circuit

According to the present invention, an exemplary AGC circuit may include (i) a comparator configured to compare an output of an amplifier against a reference voltage; (ii) gain logic configured to increase a gain of the amplifier when an output of the comparator has a first state and decrease the gain of the amplifier when the output of the comparator has a second state; (iii) a DAC configured to receive an output from the gain logic and control the gain of the amplifier; and (iv) lock detection logic configured to determine from the output of the gain logic when the gain of the amplifier is in a predetermined range.

FIG. 2 shows an exemplary AGC circuit 200 in accordance with embodiments of the present invention. Comparator 202 can compare an amplifier output, such as a mixer output (e.g., from mixer 104 of FIG. 1) or a demodulated derivative of the amplifier output, against a reference voltage (e.g., provided by voltage reference generator 204). In various embodiments, the reference voltage may be selected to correspond to the center of a substantially linear response range for inputs to the LNA (not shown in FIG. 2). Alternatively, depending on design choices and/or considerations (e.g., whether AGC logic 206 can increase the gain at a higher rate than it can decrease the gain, or vice versa), the reference voltage may be at or near an endpoint of the substantially linear response range. Comparator 202 can determine if the mixer output is greater than such a predetermined reference voltage level or amplitude. If the mixer output is greater than the reference voltage, a "high" or "1" can be output at comparator output 210. However, if the mixer output is less than the reference voltage, a "low" or "0" can be output at comparator output 210.

Comparator output 210 can then be processed by digital logic (e.g., AGC logic 206) to provide filtering, and to generate DAC controls. For example, AGC logic 206 can filter comparator output 210, and provide increment ("up") or decrement ("down") control signal assertion (e.g., in the form of a pulse) for DAC 208. Also, a DAC clock can be derived (e.g., frequency divided) from a reference clock (e.g., as provided to AGC logic 206), and used for synchronization of the up/down control signals for control of DAC 208, and/or other reference clock purposes. In operation, if a DAC 208 output (e.g., LNA control signal 222) is to be increased, the up control signal may be asserted or pulsed. Likewise, if the DAC 208 output is to be decreased, the down signal may be asserted or pulsed. Alternate arrangements can be made where the up control signal may be asserted or pulsed to decrease the DAC 208 output (i.e., decrease the amplifier gain), and the down signal may be asserted or pulsed to increase the DAC 208 output (i.e., increase the amplifier gain). In this fashion, the DAC output can be utilized to adjust an amplifier gain (e.g., an increase/decrease in the DAC output or control voltage can lead to a corresponding decrease/increase in amplifier gain) in response to output signals from gain logic 206.

Lock detection logic 212 can also receive up, down, and DAC clock inputs from AGC logic 206, and may generate signal 220 (e.g., a lock detect signal) therefrom. Generally, the lock detect signal 220 can be asserted when the AGC is near or in its locked state. For example, when the gain of the amplifier is within a predetermined range (for example, when the gain provides the amplifier output with a signal strength that is in a substantially linear range), an active lock detect signal 220 may be asserted. In addition, an enable signal can be provided to AGC logic 206 and lock detection logic 212 to reset the logic blocks when the enable signal is in an active or predetermined state (e.g., a low binary logic state).

Further, in a particular example, the reference clock can have a frequency of about 4-5 kHz, while the DAC clock can have a frequency of about 1 kHz (e.g., the reference clock frequency divided by 4). Other frequencies of operation or ranges of operation (e.g., from about 1 kHz to about 100 kHz for the reference clock, and from about 60 Hz to about 50 kHz for the DAC clock), as well as different ratios of the frequencies of the reference clock to the DAC clock (e.g., 3:1, 2:1, 5:1, 8:1, multiples thereof, etc.) can be accommodated in specific embodiments, and may depend on particular circuit implementations. Naturally, for other applications, such as RFID or HFID, other frequency ranges may apply.

Figure 3A:
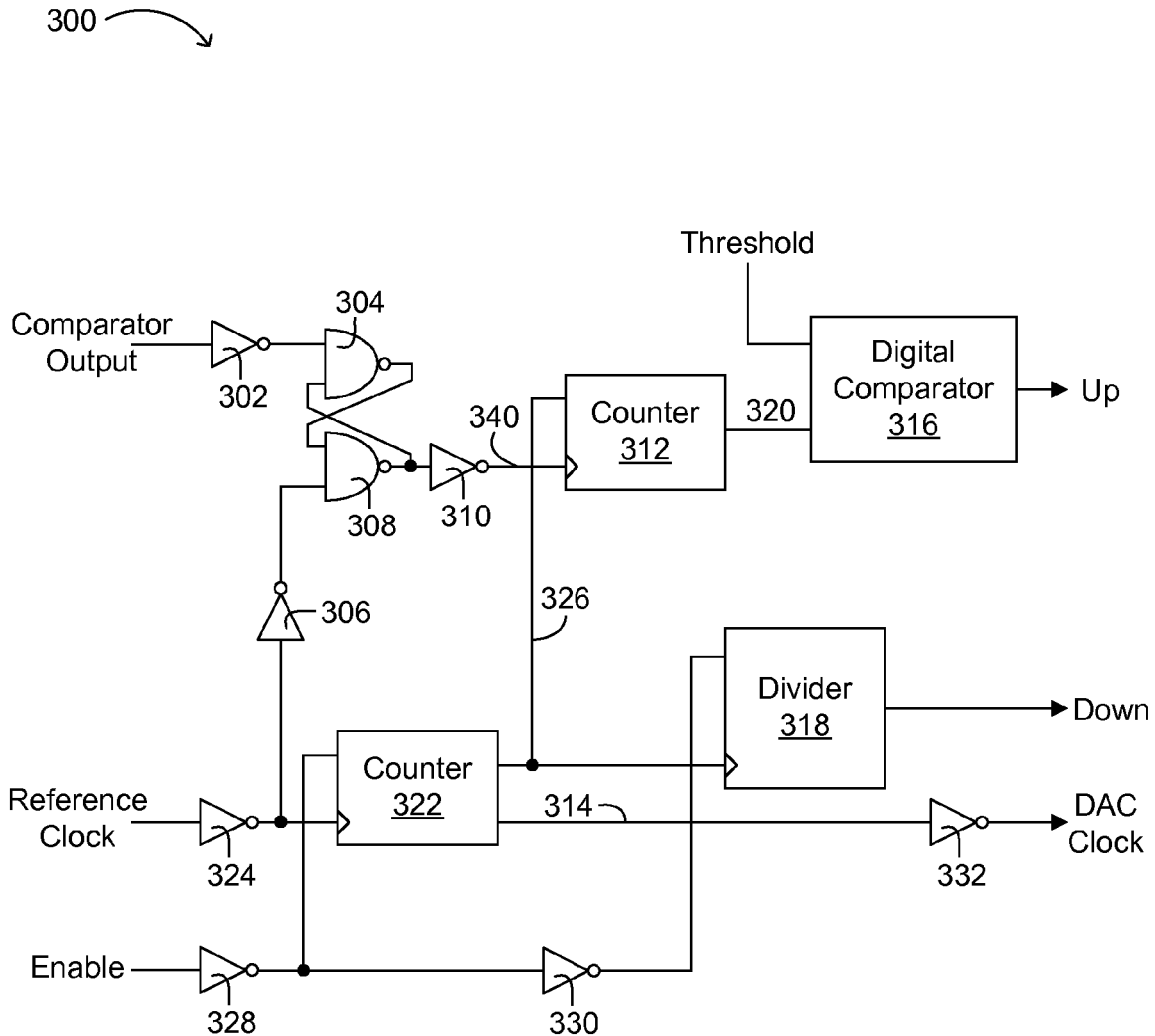
FIG. 3A is a block schematic diagram showing exemplary gain logic in accordance with embodiments of the present invention.
Figure 3B:
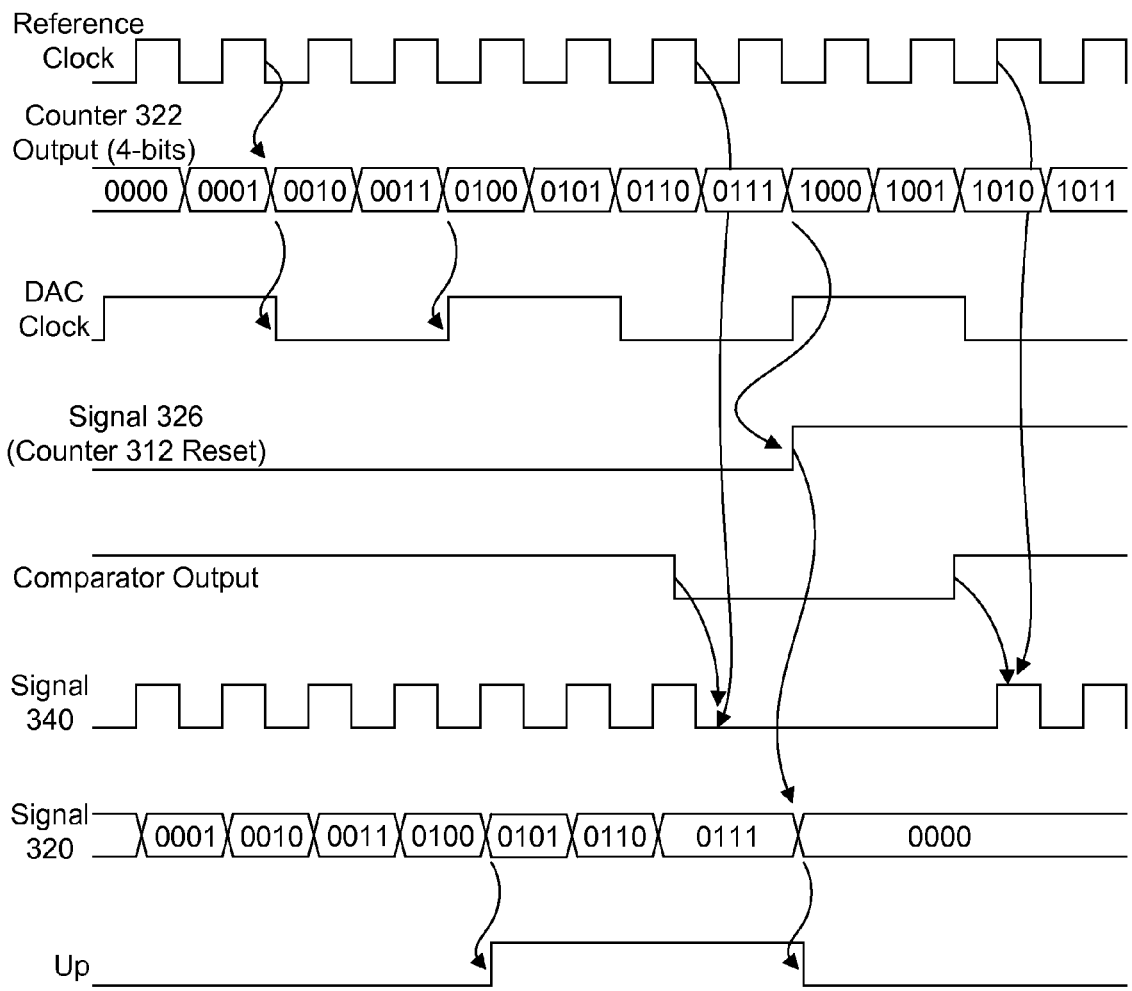
FIG. 3B is a timing diagram showing exemplary operation for the gain logic of FIG. 3A.

FIG. 3A shows exemplary gain logic 300, and FIG. 3B shows corresponding exemplary timing diagrams, in accordance with embodiments of the present invention. For example, AGC logic 206 of FIG. 2 can comprise gain logic 300, and thus, the comparator output in FIG. 3A can be signal 210 of FIG. 2. In general operation, a gain of an amplifier (e.g., with negative gain current) can be decreased (e.g., corresponding to an "up" control signal pulse that increases a count for DAC 208 for increasing the analog output thereof) when the comparator output is high. Further, "down" control signal pulses for decreasing a count for DAC 208 and decreasing the analog output thereof can be periodically asserted (e.g., at fixed time intervals apart). Thus, the comparator output state is used for determining when to assert the up control signal pulse, but the down control signal pulse may be periodically asserted regardless of the comparator output state.

In FIG. 3A, inverter 302 provides an inverted comparator output to a set (S) input of a set-reset (S-R) flip-flop/latch structure including NAND gates 304 and 308. Of course, other forms of flip-flops or latches may be suitable for driving or incrementing counter 312 with the reference clock when the comparator threshold has been exceeded. Inverters 324 and 306 effectively buffer a reference clock signal for the reset (R) input of the S-R flip-flop at NAND gate 308. Inverter 310 provides a clock control or input 340 for counter 312 such that a rising edge can occur when the comparator output is high and the reference clock is high, thus updating count output 320. When the comparator output remains high, a particular count state at node 320 can be held while the reference clock is low, thus resetting the S-R flip-flop output (e.g., via NAND gate 308 and inverter 310). Other types of flip-flops (e.g., D-type, J-K type, T-type, etc.) or latches (e.g., cross-coupled inverter latches), as well as logic gates (e.g., NOR gates, or dynamic or pre-charged logic gates) can also be used in alternative embodiments.

The S-R flip-flop/latch can also act as a filter by removing short pulses that might occur during a reference clock period. In addition, the mixer output (e.g., provided to comparator 202 of FIG. 2) can include some signals at a multiple (e.g., twice) the carrier frequency (e.g., the sum of the frequencies of the signals input to the mixer [e.g., mixer 104 in FIG. 1], the output of which is received at an input of comparator 202, but may also include the difference between the frequencies of the mixer input signals). In one application (e.g., recovery of a real-time clock signal from a standard and/or periodic radio signal), these signals may be in the 40-80 kHz range, while the reference clock frequency may be about 4.96 kHz (or an integer multiple and/or fraction thereof). This combination of the S-R latch and lower sampling rate due to the relatively low reference clock frequency can have the effect of peak detecting the mixer output. When the mixer output crosses the comparator threshold (e.g., voltage reference level), this comparison result state (e.g., comparator high) is latched via the S-R latch, resulting in clock control 340 following the reference clock. This comparison result thus causes a pulse to occur at the input 340 to counter 312 at a rate of about 4 kHz (e.g., about the reference clock frequency) for each successive comparison result having the same state, and no pulse to occur when the comparison result state changes (e.g., the S-input of the S-R latch goes high when comparator output goes low). This can be seen in FIG. 3B by clock control signal 340 going low in response to the comparator output going low, and holding a count state at signal 320 (e.g., '0111') until being reset.

The reference clock, inverted by inverter 324, can be used for clock control of counter 322, which can be reset by an inverted version of the enable signal via inverter 328. For example, counter 322 can effectively be a 4-bit counter, and may provide a most significant bit (MSB) signal 326 to a reset input of counter 312 and to a clock input of divider 318. Counter 322 can also provide a second-to-least significant bit (LSB) signal 314 (e.g., bit[1]) to inverter 332 for driving the DAC clock. As shown in FIG. 3B, an inverted or buffered bit[1] value from an output of counter 322 can be used to generate the DAC clock. Further, any n-bit counter, where n is an integer greater than or equal to 2 (e.g., n equals 4, 6, or 8) can be used in certain embodiments for counters 312 and/or 322. In one embodiment, counter 312 (e.g., a 4-bit counter) for "up" control signal generation can be reset by signal 326 generated from 5-bit "down" counter 322. For example, signal 326 can pulse once (e.g., as an MSB of a 5-bit counter) every 16 reference clock pulses, thus causing counter 312 to count from 0-15 at a repeat rate of the reference clock divided by 16 (e.g., 256 Hz), depending upon the comparator output. Accordingly, the up control signal pulses can be at a 256 Hz rate, for example. Variations of the counter widths (e.g., the number of bits it is configured to count) and/or the particular bit chosen to provide the DAC clock are certainly possible, as is readily discernable by one skilled in the art.

An output 320 (e.g., a 4-bit output) from counter 312 can be provided to digital comparator 316 for generation of the up control signal. For example, the threshold of digital comparator 316 can be set from 1-15 (e.g., 5), depending upon a desired or predetermined sensitivity level relative to an input signal received. As shown in FIG. 3B, an up control signal can thus be asserted when signal 320 meets or exceeds the digital threshold value (e.g., 5). For example, down control signal pulses can include a 4 Hz pulse generated by dividing the reference clock frequency (e.g., about 4 kHz) through counter 322 (e.g., via a 4-bit counter MSB) and divider 318 (e.g., a divide by 256, or divide by $2^m$, where m is an integer greater than or equal to 5 (e.g., where m equals an integer value in the range of 7-15), the divider being enabled by a buffered version of the enable signal via inverter 330). Thus, up control signals can occur in response to a digital threshold comparison (e.g., via 316) with a counter output (e.g., 320), whereas down control signals may occur periodically at a much slower rate, but without such a comparison. In this fashion, the DAC controlled by up/down control signal pulses can provide an amplifier gain control signal that increases relatively quickly (e.g., at a relative rate of about 15-2000×, and in one example, about 256×), yet decreases relatively slowly (e.g., at a relative rate of about 1×). Thus, the AGC can include a peak detecting characteristic. Further, the DAC clock rate can allow for non-overlapped clocking in the DAC at a relative rate or frequency that differs from that of the reference clock and that of the up control signal.

Figure 4:
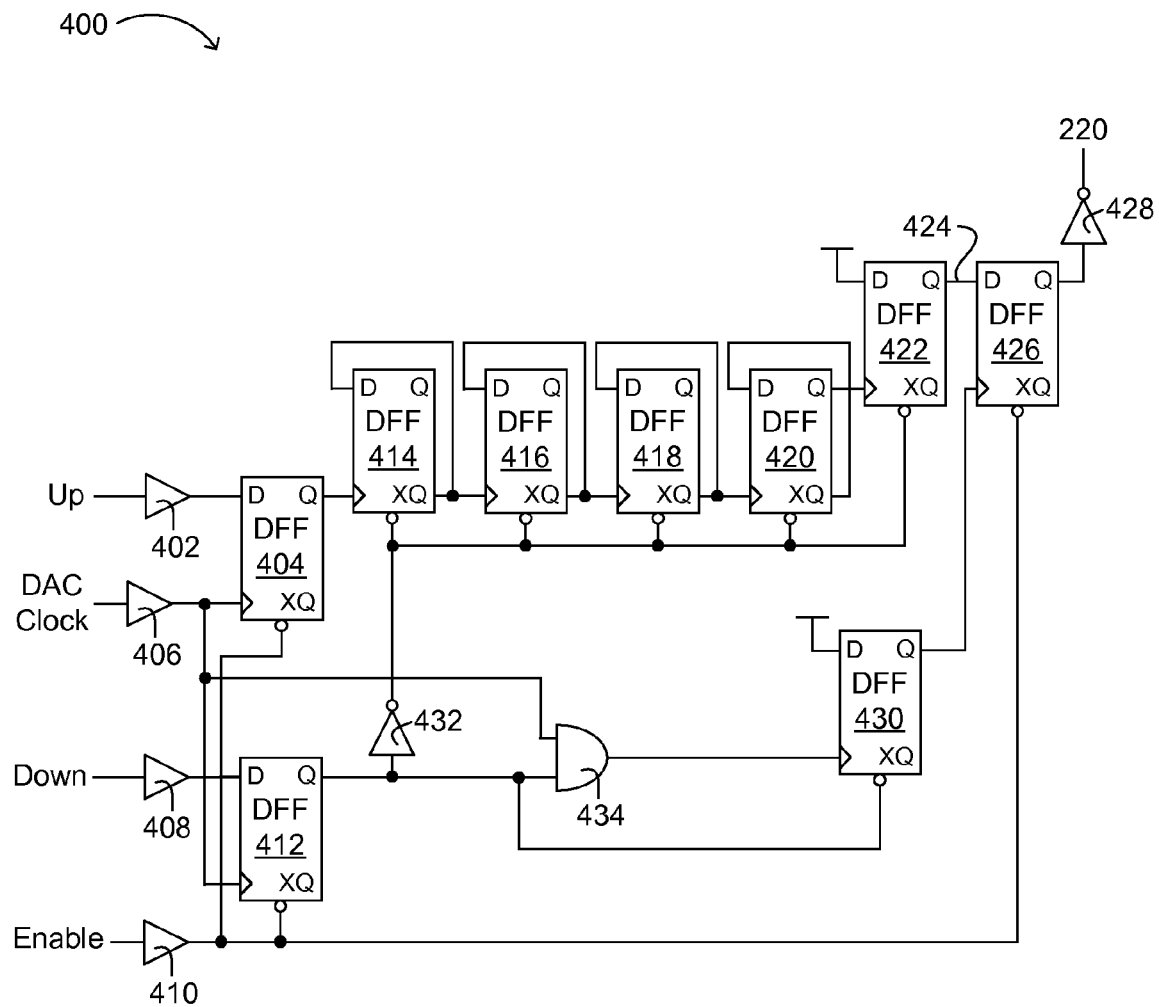
FIG. 4 is a block schematic diagram showing exemplary lock detection logic in accordance with embodiments of the present invention.

Using up/down control signal pulses and the DAC clock, the lock detect signal 220 can be asserted when the AGC loop is locked. FIG. 4 shows exemplary lock detection logic 400 in accordance with embodiments of the present invention. For example, when the AGC loop is locked, when a periodic down control pulse occurs (e.g., at a rate of 4 Hz in one implementation), a corresponding up control pulse can occur to compensate for the down control pulse. If the AGC loop is not locked, there can be up to 64 "up" control signal pulses per "down" control signal pulse, for example, when the up control signal has a frequency of 256 Hz and the down control signal has a frequency of 4 Hz. In specific embodiments, more than one, but less than or equal to eight, up control signal pulses per down control signal pulse for two consecutive down pulse cycles can define a predetermined range for lock detection. Accordingly, a number of up control signal pulses exceeding eight per down control signal cycle results in a detection of a no lock state (e.g., lock detect signal 220 goes low).

In FIG. 4, D-type flip-flops (DFFs) 404 and 412 may be used to synchronize the up control signal (e.g., via buffer 402) and down control signal (e.g., via buffer 408) to the DAC clock (e.g., via buffer 406). The up control pulses may then be counted using DFFs 414, 416, 418, and 420, arranged in a 4-bit counter configuration. This counter can be reset using a synchronized down control pulse via DFF 412 by way of inverter 432. Also, the MSB of this counter can be provided to a clock input of DFF 422, which thus latches a high level when the counter reaches eight (a binary "1000" value). Output 424 can be input to DFF 426 for providing a 2-cycle count for lock detect signal 220 via inverter 428. Further, a delay circuit can be included to delay signal 424 between DFFs 422 and 426. To clock DFF 426, DFF 430 can be utilized, where DFF 430 is clocked by a logical AND (434) combination of the DAC clock via buffer 406 and an output from DFF 412. In addition, the enable signal can be buffered via 410 and provided to reset inputs of DFFs 404, 412, and 426.

An Exemplary Method of Amplifier Gain Control

An exemplary method of controlling a gain of an amplifier using AGC according to various embodiments of the present invention may include the steps of: (i) comparing an output of the amplifier against a reference voltage to provide a comparison result; (ii) decreasing the gain of the amplifier using gain logic when the comparison result has a first state, and periodically increasing the gain of the amplifier using the gain logic; and (iii) determining from an output of the gain logic when the gain of the amplifier is in a predetermined range.

Figure 5:
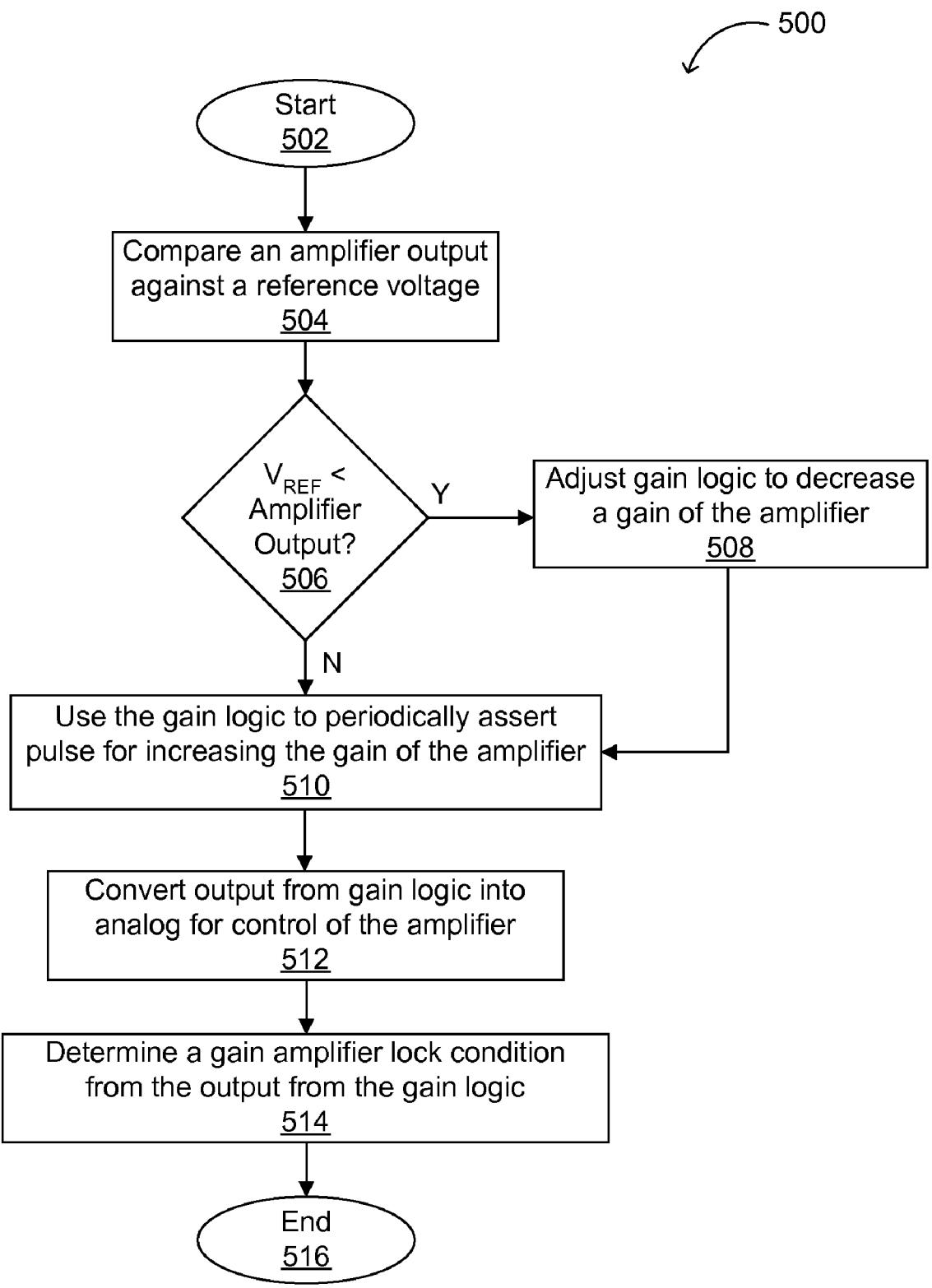
FIG. 5 is a flow diagram showing an exemplary method of controlling an amplifier gain using AGC in accordance with embodiments of the present invention.

FIG. 5 shows an exemplary method 500 of controlling an amplifier gain using AGC in accordance with embodiments of the present invention. The flow can begin (502), and an amplifier output can be compared against a reference voltage (504). For example, comparator 202 of FIG. 2 can be utilized for comparison of a mixer output against a generated reference voltage, where the mixer output can result from mixing a reference clock and an amplifier output. If the reference voltage is less than the amplifier output (506), the gain logic can be adjusted to decrease a gain of the amplifier (508). For example, such decreasing can be performed by using control signals such as the "up" control signal pulses generated via an S-R latch, a counter, and a digital comparator (e.g., see FIG. 3A), for a negative gain current amplifier.

As discussed above, the "down" control signal pulses are periodically asserted regardless of the state of the comparator output. Thus, if the reference voltage is less than or greater than the amplifier output (506), the gain logic can also be used to increase the amplifier gain (510). For example, such increasing can be performed by using control signals such as the "down" control signal pulses generated via a counter (e.g., a 4-bit counter) and a divider (e.g., see FIG. 3A) at fixed intervals. Also, a second reference clock (e.g., DAC clock, about 1 kHz) can be frequency divided from a first reference clock (e.g., about 4 kHz). For controlling the amplifier, the gain logic output can be converted (e.g., using a DAC) to analog format (512). Controls for such a DAC can be output from the gain logic (e.g., up, down, and DAC clock signals in FIG. 2). Further, a gain amplifier lock condition can be determined utilizing the output from the gain logic (514), and the flow can complete (516). For example, up, down, and DAC clock signals, as well as an enable signal, can be provided to lock detection logic 212 in FIG. 2.

Figure 6:
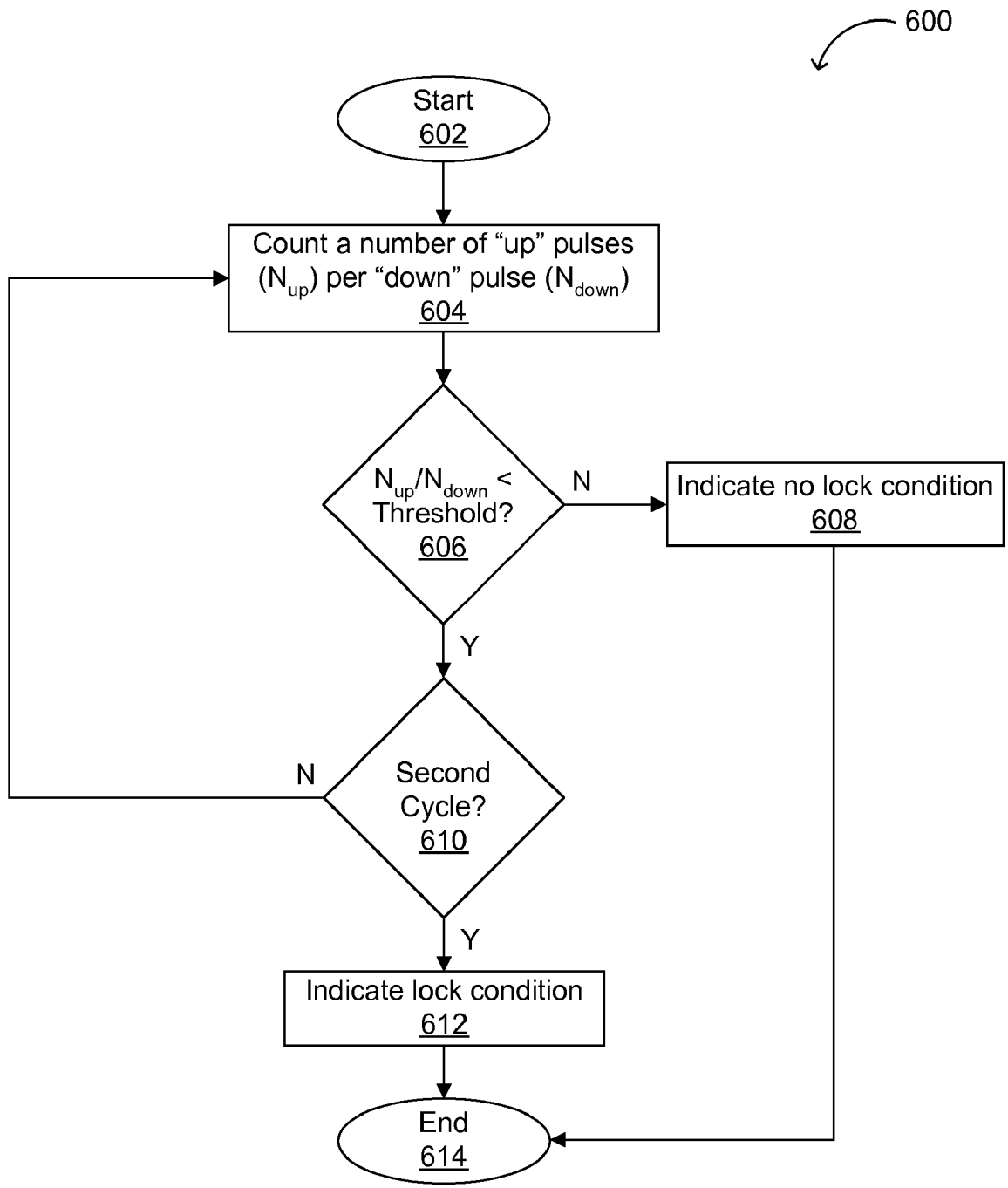
FIG. 6 is a flow diagram showing an exemplary method of detecting a lock condition using outputs from the gain logic in accordance with embodiments of the present invention.

FIG. 6 shows an exemplary method 600 of detecting a lock condition using outputs from the gain logic in accordance with embodiments of the present invention. The flow can begin (602), and a number of up control signal pulses can be counted for each down control signal pulse (604). As discussed above, the down control signal pulses can be asserted periodically at fixed intervals, and regardless of a state of the comparator output, while the up control signal pulses may be asserted when the comparator output is high, and also based on a result of a comparison with a digital threshold (e.g., using digital comparator 316). This number of up control signal pulses per down control signal pulse can be compared against a predetermined pulse number threshold (606), where the number of up control signal pulses per down control signal pulse exceeding this threshold indicates a no lock condition (608), completing the flow (614).

In specific embodiments, more than one, but less than or equal to eight, up control signal pulses per down control signal pulse for two consecutive down pulse cycles can define a predetermined range for lock detection. Accordingly, a number of up control signal pulses exceeding eight per down control signal cycle results in a detection of a no lock state (e.g., lock detect signal 220 goes low). For determining a lock condition, the number of up control signal pulses per down control signal pulse must be less than a predetermined threshold (606), and this situation must occur for at least two consecutive down control signal cycles (610). Thus, a lock condition can be indicated (e.g., by lock detect signal 220 going high) if the number of up control signal pulses is less than a predetermined number for each down control signal pulse for two consecutive cycles, thus completing the flow (614). During an active locked condition, the gain of the amplifier is not adjusted, thereby ensuring useful conditions for signal recovery and (to the extent signal states are not actively switching) saving power.

While the above examples include primarily digital implementations of AGC circuitry, one skilled in the art will recognize that other implementations and/or technologies may also be used in accordance with embodiments. Further, one skilled in the art will recognize that current-based differential signaling and/or control may also be used in accordance with embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An automatic gain control (AGC) circuit, comprising:
    a) a comparator configured to compare an output of an amplifier against a reference voltage;
    b) gain logic configured to decrease a gain of said amplifier when an output of said comparator has a first state, and to periodically increase said gain of said amplifier;
    c) a digital-to-analog converter (DAC), configured to receive an output from said gain logic and control said gain of said amplifier; and
    d) lock detection logic configured to determine from said output of said gain logic when said gain of said amplifier is in a predetermined range;
    wherein said gain logic is configured to provide a second control signal pulse in response to a frequency-divided version of a reference clock.

2. The AGC circuit of claim 1, wherein said output of said amplifier is configured to be mixed with a reference clock.

3. The AGC circuit of claim 1, wherein said gain logic is configured to provide a first control signal pulse in response to said first state of said output of said comparator.

4. The AGC circuit of claim 1, wherein a frequency of said first control signal pulse is greater than eight times a frequency of said second control signal pulse.

5. The AGC circuit of claim 1, wherein said gain logic comprises:
    a) a latch configured to receive said output of said comparator and said reference clock, and to provide a clock input to a first counter, said first counter providing a first counter signal;
    b) a second counter configured to receive said reference clock, and to provide a second counter signal and a control clock, wherein said second counter signal is configured to reset said first counter;
    c) a digital comparator configured to compare said first counter signal against a predetermined threshold, and to provide said first control signal; and
    d) a divider configured to provide said second control signal from said second counter signal.

6. The AGC circuit of claim 5, wherein said latch comprises a set-reset (S-R) flip-flop, said output of said comparator being coupled to a set input thereof, and said reference clock being coupled to a reset input thereof.

7. The AGC circuit of claim 5, wherein said first and second counters each comprise n-bit counters, where n is an integer of at least 2.

8. The AGC circuit of claim 5, wherein said control clock is coupled to said DAC and said lock detection logic.

9. The AGC circuit of claim 5, wherein said first counter signal comprises an n-bit value, where n is an integer of at least 2.

10. The AGC circuit of claim 5, wherein said second counter signal comprises a most significant bit (MSB) of an output of said second counter.

11. The AGC circuit of claim 5, wherein said control clock is configured to be generated using a second to least significant bit (LSB) of an output of said second counter.

12. The AGC circuit of claim 5, wherein said divider is configured to divide a frequency of said second counter signal by $2^m$, where m is an integer of at least 4.

13. The AGC circuit of claim 5, wherein said lock detection logic is configured to receive said first and second control signals and said control clock, and to generate an out of lock indication when a number of said first control signal pulses exceeds a number of said second control signal pulses by a predetermined amount for a predetermined number of said second control signal pulses.

14. The AGC circuit of claim 13, wherein said predetermined amount is at least eight, and said predetermined number of said second control signal pulses is at least two.

15. The AGC circuit of claim 13, wherein said number of said first control signal pulses is determined using an MSB of an n-bit counter, where n is an integer of at least 2.

16. A method of controlling a gain of an amplifier using automatic gain control (AGC), comprising the steps of:
    a) comparing an output of said amplifier against a reference voltage to provide a comparison result;
    b) decreasing said gain of said amplifier using gain logic when said comparison result has a first state, and periodically increasing said gain of said amplifier using said gain logic; and
    c) determining from an output of said gain logic when said gain of said amplifier is in a predetermined range;
    wherein said decreasing said gain of said amplifier comprises pulsing a second control signal.

17. The method of claim 16, further comprising receiving an output from said gain logic and converting said output from digital to analog format.

18. The method of claim 16, wherein said increasing said gain of said amplifier comprises pulsing a first control signal.

19. The method of claim 16, wherein said determining comprises counting a number of said first control signal pulses for each of said second control signal pulses.

20. The method of claim 19, wherein said determining further comprises indicating a status within said predetermined range when said number is eight or less for at least two consecutive cycles of said second control signal pulses.

21. The method of claim 18, wherein said first control signal is generated by comparing a first counter output against a predetermined threshold, said first counter output being determined by a reference clock and said comparison result.

22. The method of claim 16, wherein said second control signal is generated by dividing a second counter output, said second counter output being controlled by a reference clock.

* * * * *